(12) United States Patent
Shintani et al.

(10) Patent No.: US 8,760,582 B2
(45) Date of Patent: Jun. 24, 2014

(54) METHOD FOR SELECTING AN INPUT MEDIA SOURCE

(75) Inventors: Peter Shintani, San Diego, CA (US); Eiji Kono, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1626 days.

(21) Appl. No.: 11/703,304

(22) Filed: Feb. 6, 2007

(65) Prior Publication Data

US 2008/0186078 A1  Aug. 7, 2008

Related U.S. Application Data

(60) Provisional application No. 60/852,313, filed on Oct. 16, 2006.

(51) Int. Cl.
*H04N 5/268* (2006.01)

(52) U.S. Cl.
USPC .............................. 348/705; 348/706; 348/730

(58) Field of Classification Search
USPC ................. 348/706, 554, 558, 843, 705, 734; 710/15, 16, 62–64, 72, 73
See application file for complete search history.

(56) References Cited

U.S. PATENT DOCUMENTS

| | | | |
|---|---|---|---|
| 6,910,629 B2 * | 6/2005 | Nishigata et al. | 235/441 |
| 6,973,582 B2 * | 12/2005 | Sugiura et al. | 713/320 |
| 7,554,614 B2 * | 6/2009 | Satou | 348/734 |
| 7,880,816 B2 * | 2/2011 | Kinoshita et al. | 348/705 |
| 8,072,543 B2 * | 12/2011 | Kamida | 348/552 |
| 8,125,572 B2 * | 2/2012 | Koo | 348/730 |
| 2002/0057378 A1 * | 5/2002 | Yang | 348/705 |
| 2003/0048387 A1 * | 3/2003 | Sendelweck | 348/705 |
| 2005/0041151 A1 * | 2/2005 | Kim et al. | 348/569 |
| 2005/0134746 A1 * | 6/2005 | Brandt | 348/705 |
| 2006/0001776 A1 * | 1/2006 | Araki | 348/705 |
| 2006/0164561 A1 * | 7/2006 | Lacy et al. | 348/706 |
| 2006/0203133 A1 * | 9/2006 | Fujiwara | 348/744 |
| 2006/0221254 A1 * | 10/2006 | Chang | 348/706 |
| 2006/0256241 A1 * | 11/2006 | Suzuki et al. | 348/706 |
| 2007/0298656 A1 * | 12/2007 | He | 439/607 |

* cited by examiner

*Primary Examiner* — Jefferey Harold
*Assistant Examiner* — Humam Satti
(74) *Attorney, Agent, or Firm* — Fitch, Even, Tabin & Flannery LLP

(57) ABSTRACT

System and method for changing a current input terminal of a user device. In one embodiment of the invention, a method includes receiving an input terminal change request, requesting that a current input terminal be changed from a first input terminal to a second input terminal. The method may further include determining if an external device is connected to the second input terminal. In one embodiment of the invention, the second input terminal includes a connection detection switch. The method may also include switching to the second input terminal when the connection detection switch indicates an external device connection and skipping the second input terminal when the connection detection switch indicates no external device connected according to one embodiment of the invention.

24 Claims, 7 Drawing Sheets

METHOD FOR SELECTING AN INPUT MEDIA SOURCE

CROSS-REFERENCE TO RELATION APPLICATION

This application claims the benefit of U.S. Provisional Application No. 60/852,313, filed Oct. 15, 2006.

FIELD OF THE INVENTION

The present invention relates in general to a method and apparatus to improve the switching input response of a device which has multiple inputs.

BACKGROUND

As the number of inputs to a TV receiver, monitor or any product with multiple inputs increases, the number of actions to select a required input and time spent by a user also increases. Current switching input response devices for TV receivers require a user to press the input select toggle button, either on the TV receiver or on a remote control, for each input connection available. The receiver takes a finite time interval to determine whether a signal is present on the selected input, and time is further spent trying to display the input on the screen. Users are wasting more time to access a particular input device, therefore diluting the users experience with a product. Thus, there is a need for reducing the number of actions required by a user when selecting a particular input.

Another problem with current switching input devices is determining if a cable is properly connected to the input interface. If an input device is improperly attached to the input interface, the system may not recognize the improper connection. The system may then attempt to determine if a signal is present and display the input on a screen. There exists a need to detect proper insertion of a cable connector.

Accordingly, there is a need in the art to overcome one or more of the aforementioned drawbacks.

BRIEF SUMMARY OF THE INVENTION

Disclosed and claimed herein are an apparatus and method for changing a current input terminal of a user device.

In one embodiment of the invention, a method includes receiving an input terminal change request, requesting that a current input terminal be changed from a first input terminal to a second input terminal. The method may further include determining if an external device is connected to the second input terminal. In one embodiment of the invention, the second input terminal includes a connection detection switch. The method according to one embodiment of the invention may also include switching to the second input terminal when the connection detection switch indicates an external device connection and skipping the second input terminal when the connection detection switch indicates no external device connected.

Other aspects, features, and techniques of the invention will be apparent to one skilled in the relevant art in view of the following detailed description of the invention.

DETAILED DESCRIPTION OF EXEMPLARY EMBODIMENTS

Figure 1:
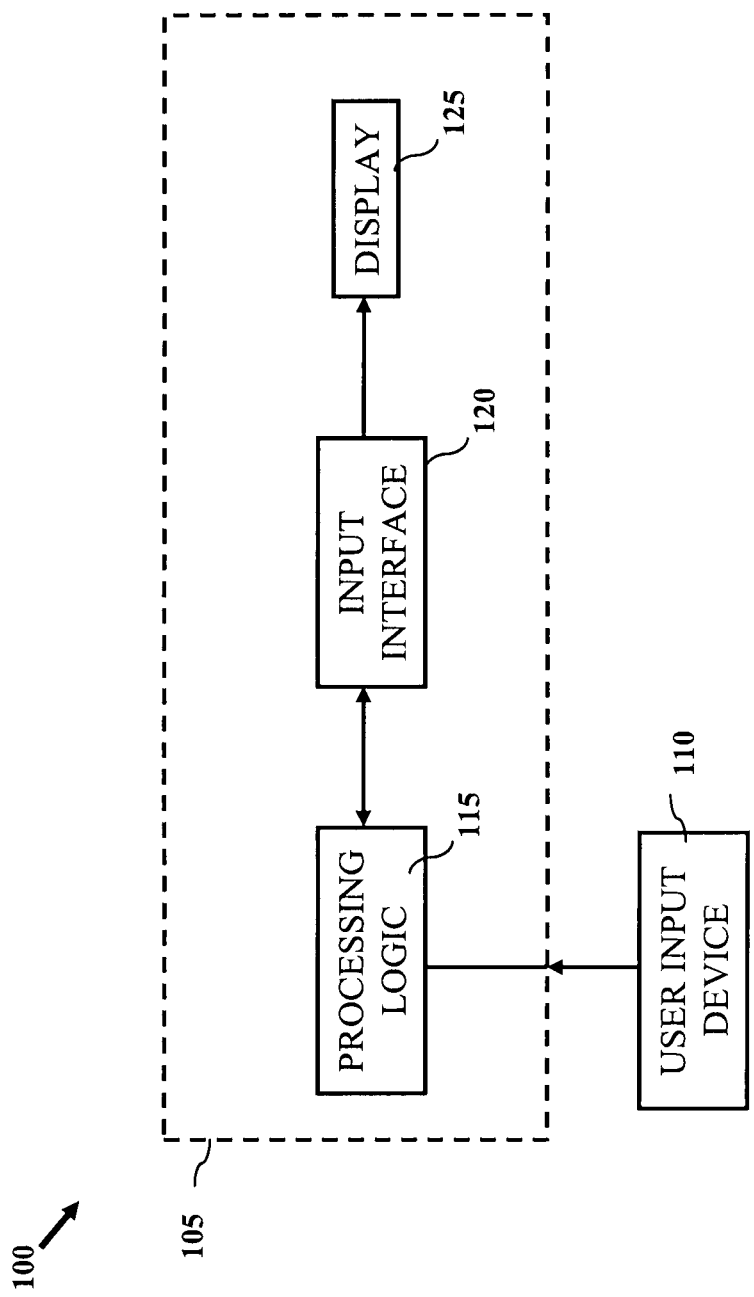
FIG. 1 depicts an embodiment of a simplified system diagram of one or more aspects of the invention.

One aspect of the invention is directed to changing a current input terminal of an electronic user device based on connection of an input terminal to an external device. According to one embodiment, an input terminal change request is received and the connection status of a second input terminal is detected with a connection detection switch. The current input may be switched to the second input terminal when the connection detection switch indicates an external device connection, or skipped when the connection detection switch indicates that the second input terminal is not connected to an external device. According to one embodiment of the invention, the connection detection switch may be a mechanical switch integrated with an input terminal. According to another embodiment, the connection detection switch may be activated by a dedicated pin or contact of an external device connection. The input terminals may correspond to composite terminals, component video terminals, audio terminals, HDMI terminals, fiber optic terminals, coaxial terminals or electronic device input terminals in general.

According to a further embodiment of the invention, determining the connection of external devices may further comprise generating a dynamic reference table of active external device connections. The reference table may be a list of active input terminals used as a reference when an input change request is received.

In another embodiment of the invention, a user electronic device is provided for advancing through a plurality of device connections. In one embodiment the user electronic device may include an input interface for connection to external devices. The input interface may include a connection detection switch. According to one embodiment, the user electronic device may include selection means coupled to the plurality of inputs and a processor coupled to the selection means. In one embodiment, when an input change request is received the processor may be configured to switch from a first input terminal to a second terminal or skip the second terminal based on the connection detection switch.

Another aspect of the invention, may be to alert a user of an improper connection to an input terminal. If a cable is not fully inserted or connected loosely to the input terminal, the user electronic device may display an alert signal or notification of the improper connection on a display associated with the electronic user device.

When implemented in software, the elements of the invention are essentially the code segments to perform the necessary tasks. The program or code segments can be stored in a processor readable medium. The "processor readable medium" may include any medium that can store or transfer information. Examples of the processor readable medium include an electronic circuit, a semiconductor memory device, a ROM, a flash memory or other non-volatile memory, a floppy diskette, a CD-ROM, an optical disk, a hard disk, a fiber optic medium, a radio frequency (RF) link, etc. The code segments may be downloaded via computer networks such as the Internet, Intranet, etc.

Referring now to FIG. 1, system 100 includes a user electronic device 105 which may include processing logic 115, an input interface 120 and a display 125. System 100 may also include user input device 110 which may be a stand alone unit or integrated with user electronic device 105. In one embodiment of the invention, user input device 110 may be a remote control device used to provide a input terminal change request to the electronic user device. According to another aspect of the invention, user input device 110 may be buttons integrated with the user electronic device 105 to provide input terminal change requests.

Figure 2:
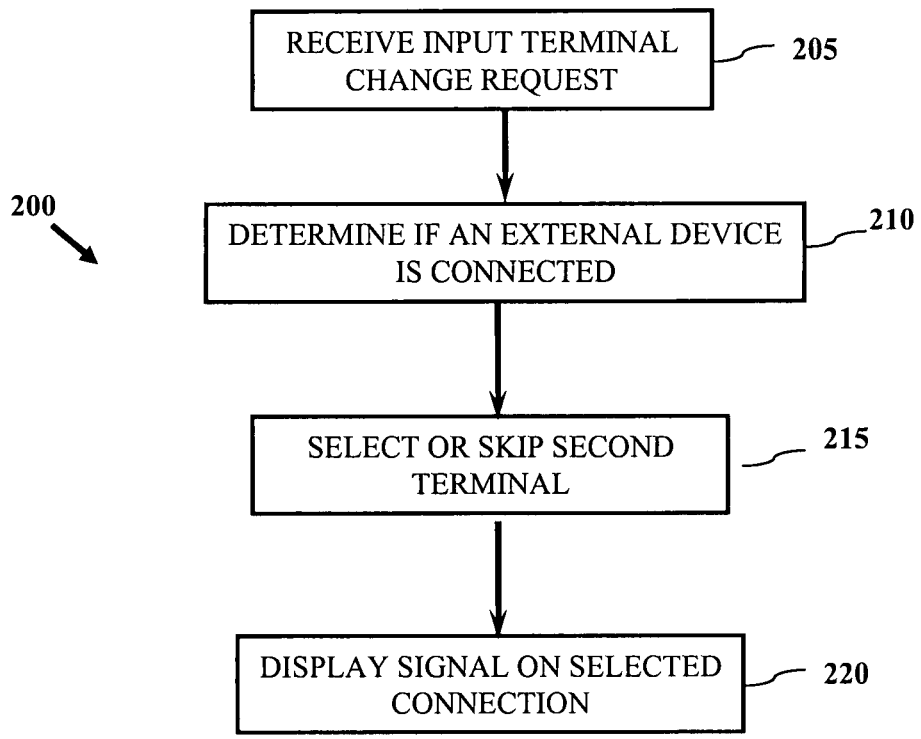
FIG. 2 depict methods steps according to one embodiment for carrying out one or more aspects of the invention.

Referring to FIG. 2, a process 200 is depicted for changing a current input terminal of a user electronic device according to one embodiment of the invention. Process 200 may be initiated when an input terminal change request is received in block 205. An input terminal change request may be received from a user input device (e.g., user input device 110). Process 200 continues with determining a connection of an external device to a second input terminal in block 210 and selecting or skipping the second terminal in block 215. According to one aspect of the invention, process 200 may also include displaying a signal provided by the selected terminal, block 220.

Figure 3:
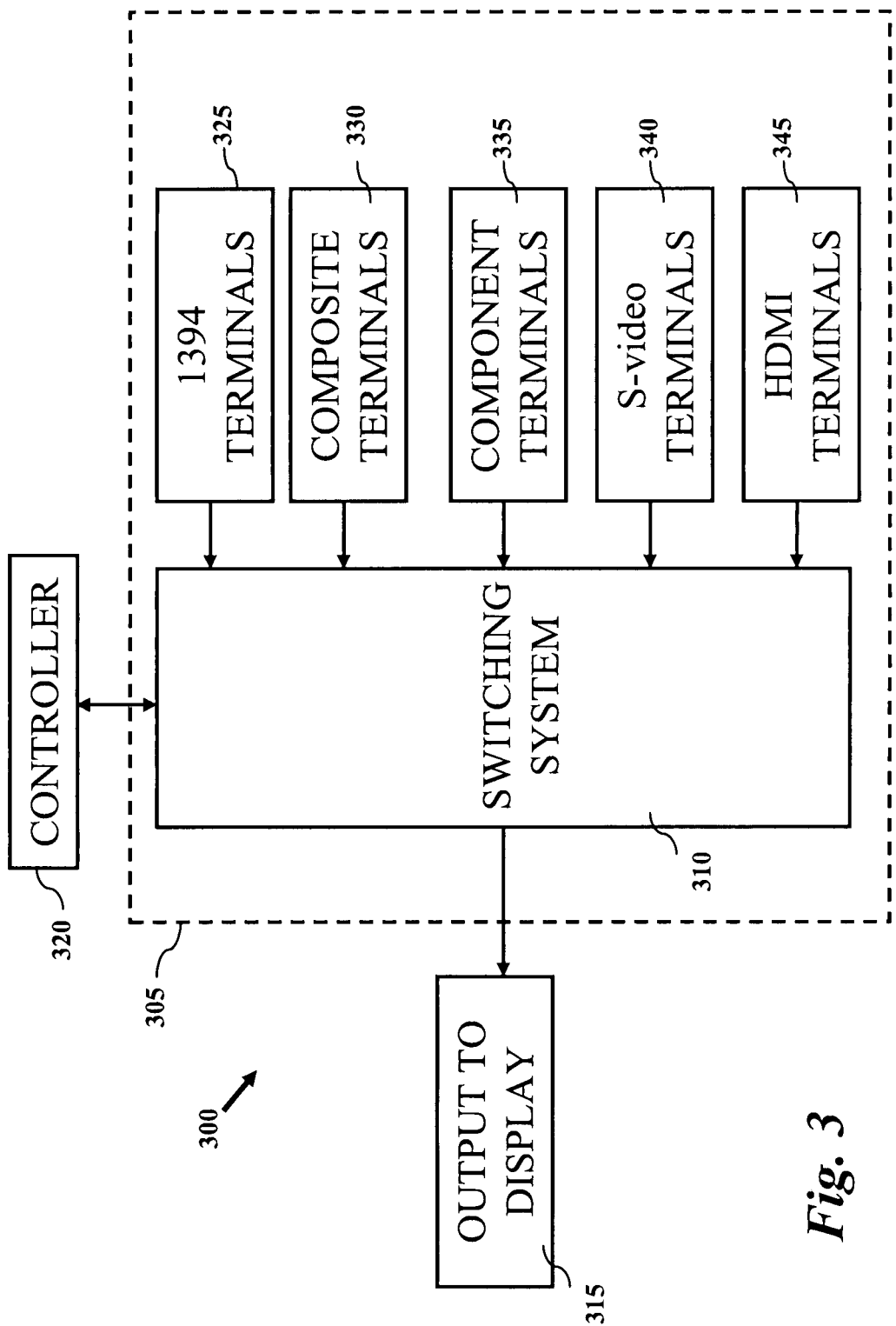
FIG. 3 depicts one embodiment of an input interface capable of carrying out one or more aspects of the invention.

Referring to FIG. 3, system 300 provides an input interface 305 according to one aspect of the invention. Input interface 305 may comprise a switching system 310 for selection of one of a plurality input sources. The input interface 305 may further comprise IEEE-1394 terminals 325, composite terminals 330, component video terminals 335, S-video terminals 340 and HDMI terminals 345 for connection to external devices. Controller 320 provides selection signals to switching system 310 and may be integrated with a processor (e.g., processing logic 115). When an input source is selected, switching system 310 provides the selected output source to output 315 (e.g., display 125).

Figure 4:
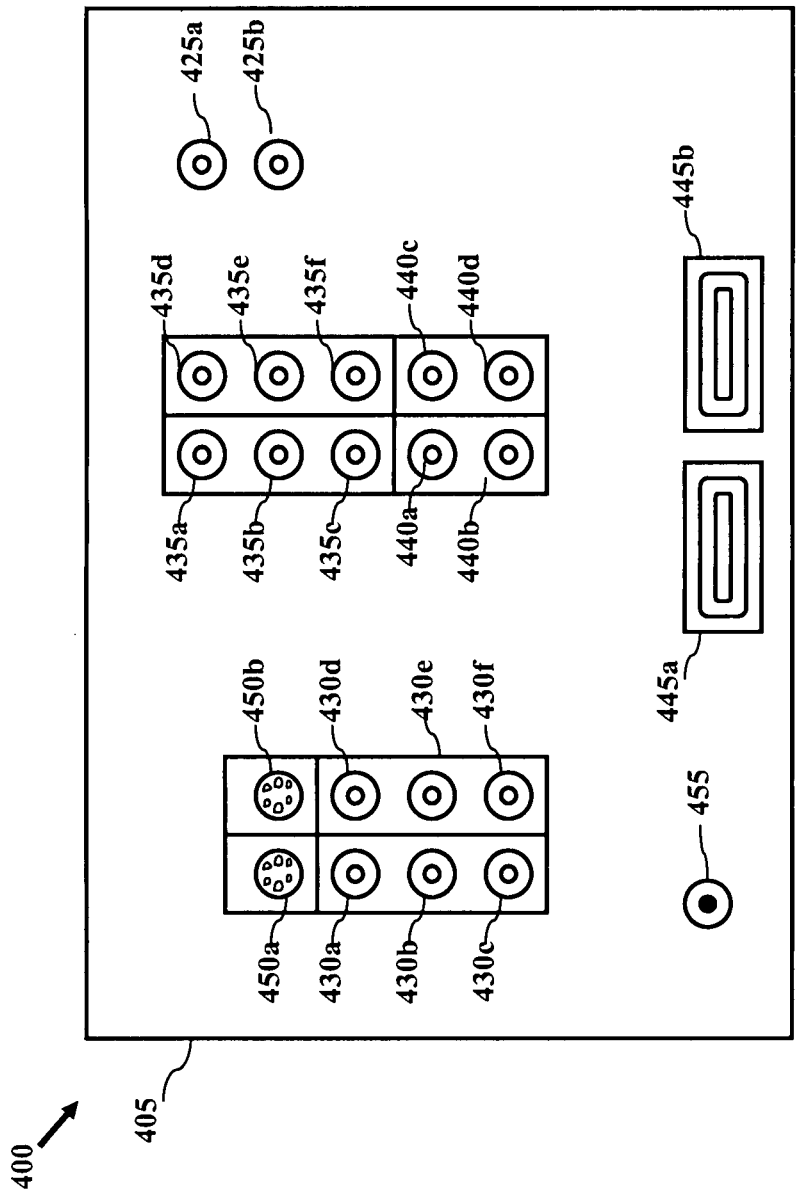
FIG. 4 depicts one embodiment of a input interface capable of carrying out one or more aspects of the invention.

Referring to FIG. 4, system 400 provides an exemplary view of an input interface 405 (e.g., input interface 120) according to one aspect of the invention. Input interface 405 may be integrated with a user electronic device such as a television or intermediate device for a display unit. According to one embodiment, the input interface may include IEEE-1394 terminals 425a-b, composite terminals 430a-f, component video terminals 435a-f, audio terminals 440a-d, HDMI terminals 445a-b, S-video terminals 450a-b and a coaxial terminal 455 for connection to external devices.

Figure 5:
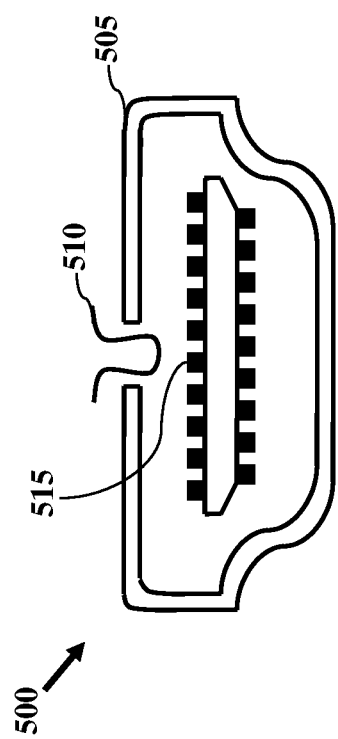
FIG. 5 depicts one embodiment of an input terminal according to one or more aspects of the invention.

Referring to FIG. 5, system 500 provides an exemplary view of an input terminal 505 and an integrated connection detection switch 510 according to one embodiment of the invention. While illustrated as a HDMI connection, it can be appreciated that input terminal 505 may correspond to other types of electrical connection input terminals and is not limited to HDMI terminals. It can further be appreciated that the location of connection detection switch 510 is not limited to the location as depicted in FIG. 5, and switch 510 may be located in any portion of input terminal 505.

Figure 6:
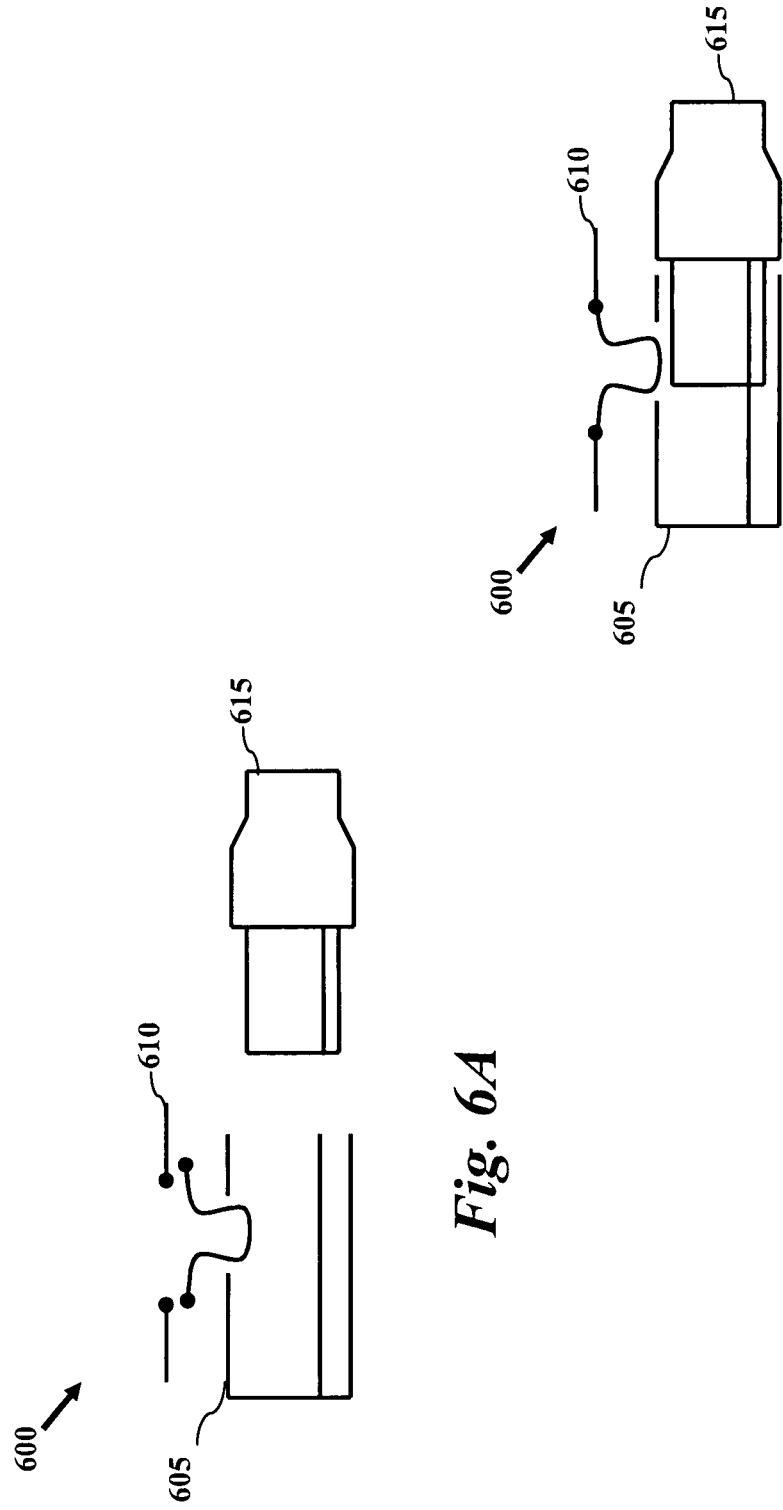
FIGS. 6A-B depict one embodiment of an input terminal capable of carrying out one or more aspects of the invention.

Referring to FIGS. 6A-B, exemplary views of connection system 600 are shown. According to one embodiment, system 600 may include input terminal 605, connection detection switch 610 and external device connector 615. Referring to FIG. 6A, input terminal 605 is not connected to external device connector 615, and connection detection switch 610 is in an open state. FIG. 6B illustrates external device connector 615 inserted into input terminal 605 with connection detection switch 610 in a closed position. According to one embodiment, connection detection switch 610 may be a mechanical switch activated by physical insertion of external device connector 615. It can be appreciated that a connection detection switch may be activated through a dedicated pin of the external device connector 615. For example, in some embodiments, connection detection switch 510 in FIG. 5 may be situated in a portion of input terminal 505 so as to be activated by a dedicated pin of external device connector 615 of FIG. 6A (e.g., corresponding to pin 515 of FIG. 5) upon insertion of external device connector 615. As noted above, connection detection switch 510 may be activated by contact of an external device connection.

Figure 7:
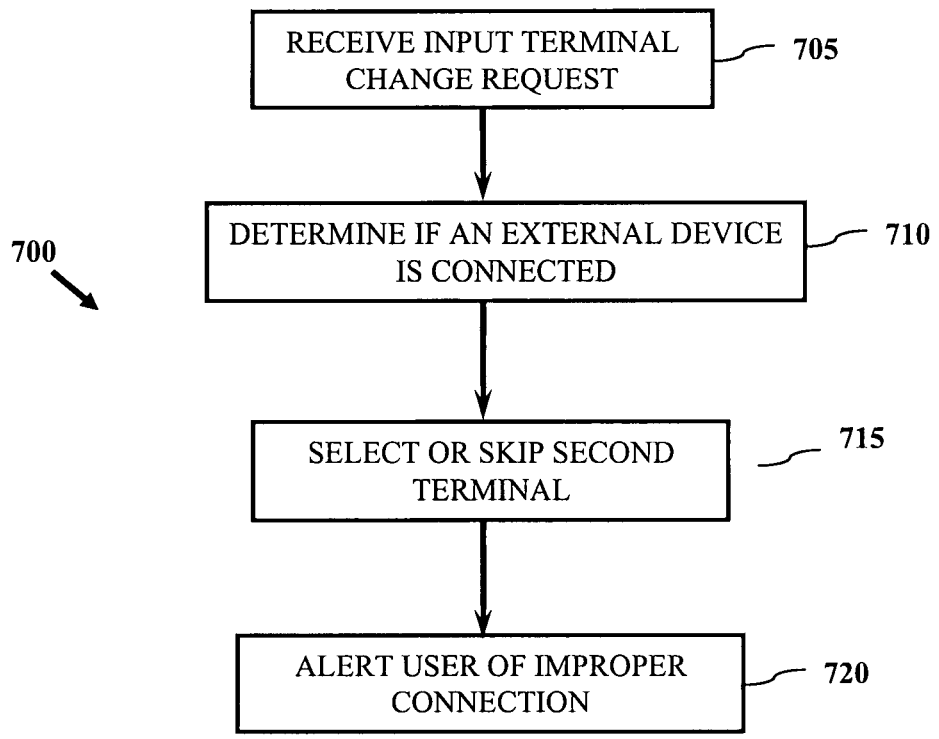
FIG. 7 depicts methods steps according to one embodiment for carrying out one or more aspects of the invention.

Referring to FIG. 7, a process 700 is depicted for changing a current input terminal of a user electronic device, wherein a user may be alerted to an improper connection of an external device according to one embodiment of the invention. Process 700 may be initiated when an input terminal change request is received in block 705. Process 700 continues with determining a connection of an external device to a second input terminal in block 710 and activating or skipping a second input terminal in block 715. According to one aspect of the invention, when a second input terminal is skipped due to an improper connection (e.g., loose connector), process 700 may also include displaying a visual alert signal or sounding an audible alert to a user, block 720.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Trademarks and copyrights referred to herein are the property of their respective owners.

What is claimed is:

1. A method for changing a current input terminal of a user electronic device comprising:
   receiving an input terminal change request, requesting that the current input terminal be changed from a first input terminal to a second input terminal;
   determining if an external device is connected to the second input terminal, wherein the second input terminal includes a connection detection switch;
   switching to the second input terminal when the connection detection switch indicates an external device connection; and
   skipping the second input terminal when the connection detection switch indicates no external device is connected, wherein the connection detection switch is activated by a dedicated pin of an external device connector.

2. The method of claim 1, wherein the determining comprises detecting a switched state of the connection detection switch.

3. The method of claim 1, wherein the connection detection switch is a mechanical switch integrated with the input terminal.

4. The method of claim 2, wherein the switched state is closed when an input cable is properly inserted into the second input terminal and open when the second input terminal is not connected to an external device connector.

5. The method of claim 1, wherein the determining comprises detecting an improper connection of an external device cable.

6. The method of claim 5, wherein the determining further comprises alerting a user when an improper connection is detected.

7. The method of claim 1, wherein the input terminals correspond to one or more of HDMI terminals, and fiber optic terminals.

8. The method of claim 1, further comprising displaying an input source provided by a selected input terminal.

9. The method of claim 1, further comprising generating a dynamic reference table of active external device connections.

10. A user electronic device with a plurality of external device connections comprising:
   an input interface having a plurality of input terminals for connection to external devices, wherein one or more of the input terminals further comprises a connection detection switch;
   selection means coupled to the plurality of input terminals; and
   a processor coupled to the selection means, the processor configured to:
      receive an input terminal change request, requesting that a current input terminal be changed from a first input terminal to a second input terminal;
      determine if an external device is connected to the second input terminal;
      switch to the second input terminal when the connection detection switch indicates an external device connection; and
      skip the second input terminal when the connection detection switch indicates no external device is connected, wherein the connection detection switch is activated by a dedicated pin of an external device connector.

11. The apparatus of claim 10, wherein the processor is further configured to detect a switched state of the connection detection switch.

12. The apparatus of claim 10, wherein the connection detection switch is a mechanical switch integrated with the input terminal.

13. The apparatus of claim 11, wherein the switched state of an input terminal is closed when an input cable is properly inserted into the second input terminal and open when the second input terminal is not connected to an external device connector.

14. The apparatus of claim 10, wherein the processor is further configured to detect an improper connection of an input device cable.

15. The apparatus of claim 14, wherein the processor is further configured to alert a user when an improper connection is detected.

16. The apparatus of claim 10, wherein the input terminals correspond to one or more of HDMI terminals, and fiber optic terminals.

17. The apparatus of claim 10, further comprising a display coupled to the processor, wherein the display is configured to display an input source provided by a selected input terminal.

18. The apparatus of claim 10, wherein the processor is further configured to generate a dynamic reference table of active external device connections.

19. The method of claim 2, wherein the switched state is open when an input cable is improperly inserted into the second input terminal.

20. The apparatus of claim 11, wherein the switched state is open when an input cable is improperly inserted into the second input terminal.

21. The method of claim 9, wherein the dynamic reference table is updated to indicate the second input terminal is active when the connection detection switch indicates an external device connection, and wherein the dynamic reference table is updated to indicate the second input terminal is inactive when the connection detection switch indicates no external device is connected.

22. The method of claim 21, further comprising referencing the dynamic reference table of active external device connections and displaying a notification of active external device connections.

23. The apparatus of claim 18, wherein the dynamic reference table is updated to indicate the second input terminal is active when the connection detection switch indicates an external device connection, and wherein the dynamic reference table is updated to indicate the second input terminal is inactive when the connection detection switch indicates no external device is connected.

24. The apparatus of claim 23, wherein the processor is further configured to reference the dynamic reference table of active external device connections and display a notification of active external device connections.

* * * * *

UNITED STATES PATENT AND TRADEMARK OFFICE
CERTIFICATE OF CORRECTION

| | | |
|---|---|---|
| PATENT NO. | : 8,760,582 B2 | Page 1 of 1 |
| APPLICATION NO. | : 11/703304 | |
| DATED | : June 24, 2014 | |
| INVENTOR(S) | : Shintani et al. | |

It is certified that error appears in the above-identified patent and that said Letters Patent is hereby corrected as shown below:

In the Specification:
Column 11, line 8, delete "Oct. 15, 2006" and insert --Oct. 16, 2006--.

Signed and Sealed this
Eighteenth Day of November, 2014

Michelle K. Lee
*Deputy Director of the United States Patent and Trademark Office*